United States Patent
Kaufman

(10) Patent No.: US 6,501,017 B2
(45) Date of Patent: Dec. 31, 2002

(54) ELECTROMAGNETIC RADIATION SEAL FOR A MEMBER PENETRATING A SHIELDED ENCLOSURE

(75) Inventor: Stephen R. Kaufman, Georgetown, TX (US)

(73) Assignee: EMC Test Systems, L.P., Austin, TX (US)

( * ) Notice: Subject to any disclaimer, the term of this patent is extended or adjusted under 35 U.S.C. 154(b) by 0 days.

(21) Appl. No.: 09/732,344

(22) Filed: Dec. 7, 2000

(65) Prior Publication Data

US 2002/0074141 A1 Jun. 20, 2002

(51) Int. Cl.[7] .................................................. H05K 9/00
(52) U.S. Cl. ................... 174/35 C; 285/149.1; 174/152 G
(58) Field of Search ........................... 174/35 R, 152 G, 174/35 MS, 35 C; 361/816, 818, 800; 257/659, 660; 285/149.1

(56) References Cited

U.S. PATENT DOCUMENTS

| | | | | | |
|---|---|---|---|---|---|
| 3,548,079 | A | * | 12/1970 | Jones | 174/153 G |
| 3,735,209 | A | * | 5/1973 | Saddler | 257/660 |
| 5,012,042 | A | * | 4/1991 | Summach | 174/35 C |
| 6,119,305 | A | * | 9/2000 | Loveall et al. | 16/2.2 |

* cited by examiner

*Primary Examiner*—Hung V. Ngo
(74) *Attorney, Agent, or Firm*—Priscilla L. Ferguson; Akin Gump Strauss Hauer & Feld, LLP

(57) ABSTRACT

An electromagnetic radiation seal, particularly adapted for sealing a rotary or linearly movable shaft penetrating a shielded enclosure includes a housing mountable on an enclosure wall and forming a cavity delimited by the housing and the shaft and which is filled with metal particulates, such as tungsten or lead shot pellets. The metal particulates are in intimate contact with the shaft and with the seal housing to prevent transmission of electromagnetic radiation between the interior and exterior of the enclosure at the penetration formed by the shaft.

14 Claims, 3 Drawing Sheets

ELECTROMAGNETIC RADIATION SEAL FOR A MEMBER PENETRATING A SHIELDED ENCLOSURE

FIELD OF THE INVENTION

The present invention pertains to a seal or shield to prevent transmission of electromagnetic radiation, particularly in the radio frequency range, along a shaft or outer tube of a coaxial cable penetrating a shielded enclosure.

BACKGROUND OF THE INVENTION

Shielded enclosures or rooms are provided for shielding certain electrical equipment and communications devices from electromagnetic interference (EMI) and so called radio frequency interference (RFI). In many applications of shielded enclosures, it is necessary to penetrate the enclosure wall with a rotating or reciprocable shaft or a coaxial cable structure for various purposes. For example, in testing communications devices in a shielded enclosure, it is often necessary and desirable to be able to rotate o r reciprocate the device within the enclosure without placing actuators, such as electrical motors and controls therefor, within the enclosure itself. In this regard, drive mechanisms for rotating or reciprocating devices within a shielded enclosure have been mounted on the enclosure wall on the exterior thereof with a rotatable or reciprocable shaft penetrating the wall. Such penetration provides a path for transmission of EMI and RFI through the enclosure wall. Heretofore this type of transmission path has been isolated or shielded by so called labyrinth type shields. Labyrinth type shields or seals for EMI and RFI shielded enclosures are relatively complicated devices requiring close tolerance machining and assembly processes in order to ensure that an electromagnetic radiation signal on one side of the penetration is not detectable on the other side of the penetration of the enclosure wall. These precisely machined parts are subject to wear and the shielding performance of same tends to degrade over time.

Consequently, there has been a need and desire to provide improved means for shielding shafting and cable outer conductors or sleeves, for example, in applications where these devices must penetrate the wall of a shielded enclosure. Moreover, prior art devices and methods for shielding cylindrical shafts or cable outer sleeves do not suitably provide for a shaft or other structure which must be moved or reciprocated linearly along its longitudinal axis rather than rotated about such axis. It is to overcome the problems associated with prior art methods and structures for shielding or sealing the transmission of EMI and RFI that the present invention has been developed.

SUMMARY OF THE INVENTION

The present invention provides a shield or so-called seal mechanism to prevent the transmission of electromagnetic interference or radio frequency interference through a wall of a shielded enclosure which has been penetrated by a rotatable, or axially movable shaft, in particular.

In accordance with one aspect of the present invention, an electromagnetic radiation seal is provided for a rotatable or linearly movable, generally cylindrical shaft or tube penetrating a wall of a shielded enclosure to prevent transmission of electromagnetic interference or radio frequency interference through the wall by way of the shaft or tube.

In accordance with another aspect of the invention, an electromagnetic radiation seal is provided for a shaft or tube wherein an electrically conductive media is in intimate contact with the shaft or tube to redirect the radiation and prevent transmission of same into or out of the interior of a shielded enclosure penetrated by the shaft or tube. The seal also provides for supporting a rotatable or linearly movable shaft or tube on suitable spaced apart bearings. In one embodiment of the invention, the seal also includes axial shaft locating collars to prevent axial excursion of the shaft and to contain the conductive media. In another embodiment, rotation and/or linear reciprocation or oscillation of the shaft is permitted without loss of electromagnetic radiation sealing capability.

Those skilled in the art will further appreciate the above mentioned advantages and superior features of the invention together with other important aspects thereof upon reading the detailed description which follows in conjunction with the drawings.

DETAILED DESCRIPTION OF THE PREFERRED EMBODIMENTS

Figure 1:
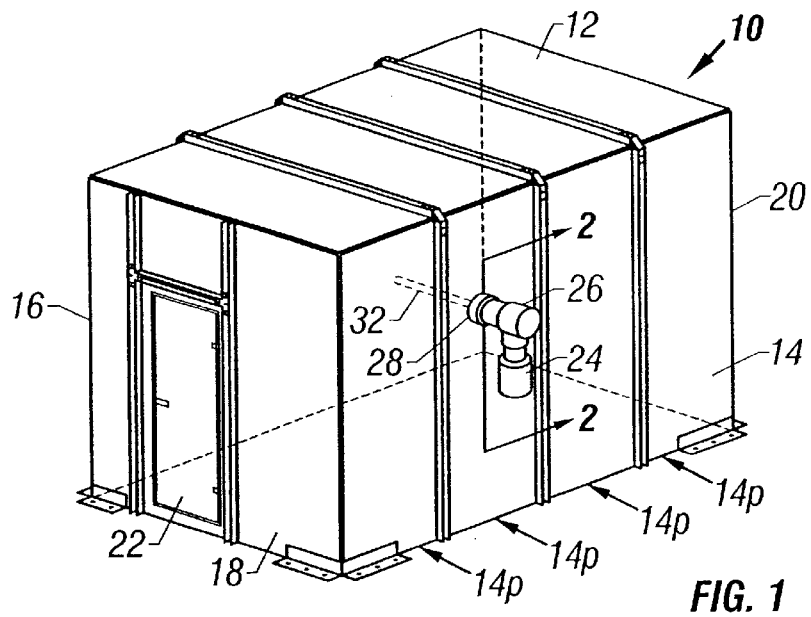
FIG. 1 is a perspective view of a shielded enclosure for EMI and RFI testing purposes and showing an arrangement including a motor driven shaft which includes a radiation seal in accordance with the invention.

In the description which follows, like parts are marked throughout the specification and drawing with the same reference numerals, respectively. The drawing figures are not necessarily to scale and certain components may be shown in somewhat generalized form in the interest of clarity and conciseness.

Referring to FIG. 1, there is illustrated a shielded enclosure, generally designated by the numeral 10, of a type typically used in performing certain tests and measurements on electrical equipment and electronics and communication devices which omit electromagnetic radiation including radio frequency radiation. The enclosure 10 may be used for various purposes, including electromagnetic compatibility testing, instrument calibration, radio repair and as a computer room. Enclosure 10 is a generally rectangular box or room having a ceiling 12, opposed side walls 14 and 16 and opposed end walls 18 and 20. A door 22 is provided for access to the interior of the enclosure 10. Shielded enclosures of the general type described hereinabove are commercially available from EMC Test Systems, L.P., the assignee of the present invention.

In many applications of shielded enclosures, such as the enclosure 10, it is necessary to provide for longitudinal or rotary movement of a device within the interior of the enclosure, while at the same time it is necessary or desirable to place the motor or drive mechanism for rotating or oscillating the device on the exterior of the enclosure so that the motor and/or associated drive mechanism will not emit electromagnetic radiation or so called electromagnetic interference (EMI) within the interior of the enclosure and thereby interfere with procedures in the enclosure.

Figure 2:
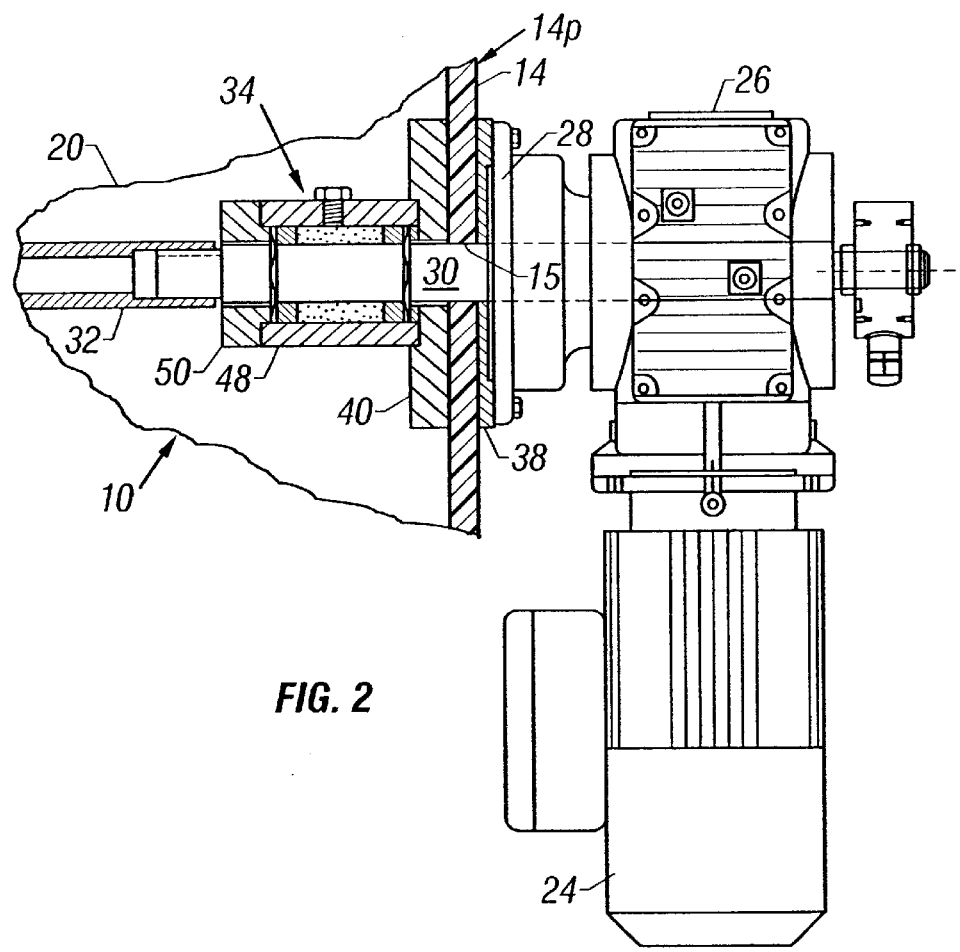
FIG. 2 is a view taken generally from the line 2—2 of FIG. 1.

As shown in FIGS. 1 and 2, an electric motor 24 is connected to a conventional right angle gear drive mechanism 26 having a mounting bracket 28 provided therefor and drivably connected to a rotatable shaft 30, see FIG. 2, which penetrates the wall 14 at a suitable through bore 15 formed therein. Accordingly, the motor 24 may be operable to rotate the shaft 30 in opposite directions to rotate a mechanism or device, not shown, by way of a second shaft 32 and which is disposed in the interior of the enclosure 10. However, in the arrangement shown in FIGS. 1 and 2, if the shaft 30 is not suitably "sealed", it is operable to transmit electromagnetic radiation therethrough between the exterior of the enclosure 10 and the interior, which transmission may adversely affect the procedures being carried out in the interior of the enclosure 10.

In accordance with the invention, there has been developed an improved electromagnetic radiation shield or so called seal to prevent transmission of electromagnetic radiation, particularly in the radio frequency range, from the exterior of the enclosure to the interior and vice versa.

Figure 3:
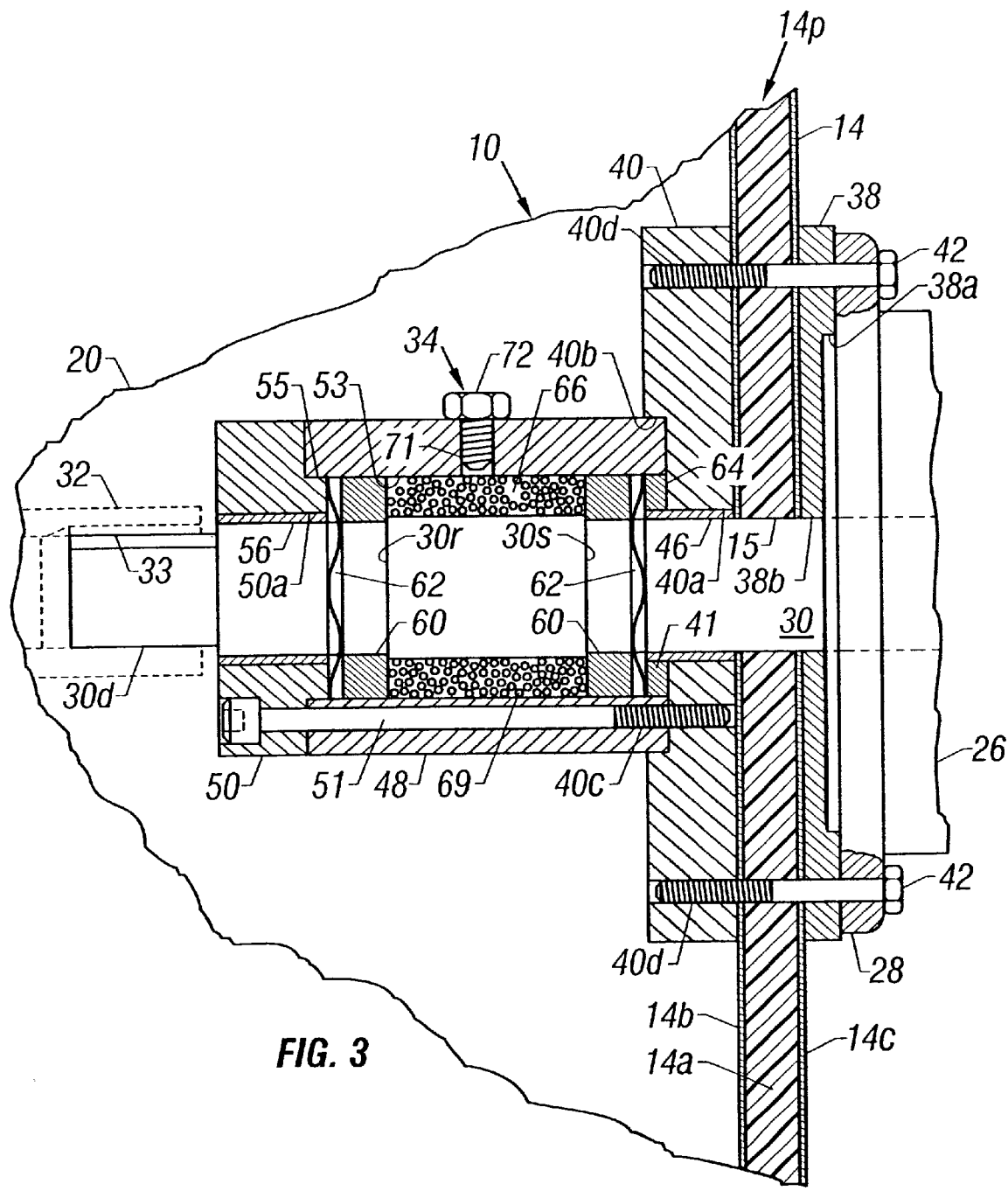
FIG. 3 is a section view of the seal mechanism shown in FIG. 2 on a larger scale and taken generally from the same line as the view of FIG. 2.

Referring further to FIG. 2, an EMI seal mechanism in accordance with the invention is illustrated and generally designated by the numeral 34. The seal 34 is supported primarily on the interior of the enclosure 10 at the wall 14 in the manner illustrated in FIG. 2 and also illustrated on a larger scale in FIG. 3. Referring primarily to FIG. 3, the wall 14 is typical of the wall structures which form the enclosure 10 and includes plural panels 14p, each comprising a basically nonconductive core part 14a and inner and outer thin metal sheets or skins 14b and 14c.

The panels 14p making up the wall 14 each include a core part 14a and, preferably, medium gauge galvanized steel sheets 14b and 14c adhered to the core part on opposite sides, respectively, to form reflective and conductive skins of the panel. A substantial amount of electromagnetic interference (EMI) is reflected off of the sheets 14b or 14c and the core part 14a substantially absorbs any residual EMI. However, as a consequence of the bore 15 and the shaft 30 penetrating the wall 14, an EMI leakage path is provided between the interior of the enclosure and the exterior thereof. This leakage path is obstructed by the seal 34 in accordance with the invention.

Referring further to FIG. 3, the mounting bracket or flange 28 is contiguous with a generally cylindrical flat metal mounting plate 38 disposed on the exterior of the wall 14 and contiguous with the panel sheet or skin member 14c. Plate 38 includes a suitable pilot bore 38a formed therein for locating the motor mounting bracket or flange 28. A second, generally cylindrical flat metal plate 40 is disposed on the interior of the wall 14, is contiguous with the sheet or skin 14b and is secured to the panel 14p and to the plate 38 by suitable threaded machine screws 42 which extend through the flange 28 at suitable bolt circle bores formed therein, corresponding bores formed in the plate 38 and corresponding threaded bores 42d formed in the plate 40. Plate 38 includes a clearance bore 38b for shaft 30 and plate 40 supports a cylindrical sleeve bearing 46 for the shaft 30. The sleeve bearing 46 may be a self lubricating type such as a silicon bronze graphite bearing or bushing of a type commercially available and disposed in a cylindrical bore 40a formed in the plate 40.

The plate 40 is also counterbored at a cylindrical bore 40b for receiving a generally cylindrical metal seal housing 48, FIG. 3, which is suitably mounted on the plate 40 by elongated machine screws 51, one shown in FIG. 3, extending between a removable housing end cap 50, through the housing 48 and threadedly engaged with suitable threaded bores 40c in the plate 40, one shown. Accordingly, the end cap 50, the housing 48 and the plate 40 are held in assembly by plural circumferentially spaced, preferably, socket-head type machine screws 51.

Housing 48 includes a relatively large diameter central cylindrical bore 53 formed therein and extending therethrough. End cap 50 includes a generally cylindrical hub portion 55 extending within the bore 53 at one end thereof as shown. End cap 50 also supports a second shaft bearing 56 which may be similar to or identical to the bearing 46 and suitably retained in a bearing bore 58 formed in the end cap 50, as shown in FIG. 3. The distal end 30d of shaft 30 may be characterized as a suitably reduced diameter portion of the shaft drivably connected to shaft 32 by way of a conventional key 33, FIG. 3. Shaft 30 also includes an enlarged diameter portion delimited by opposed annular shoulders 30r and 30s which are engaged with generally cylindrical metal collars or retaining rings 60 disposed in the bore 53 and engaged with cylindrical wavewasher type springs 62, as shown. Retaining rings 60 are thus biased by the wavewasher springs 62 in engagement with shoulders 30r and 30s to substantially axially locate or "center" the shaft 30 with respect to the seal housing 48. An annular retaining collar 64 is also disposed in housing bore 53 between one of the wave washer springs 62 and an end wall 41 of plate 40 formed by the counterbore 40b.

An elongated annular cavity 66 is formed in housing 48 between the retaining rings 60 and between the shaft 30 and the bore 53. The cavity 66 is substantially filled with an electrically conductive media, such as metal particulates, which are in intimate contact with each other and with the housing wall forming bore 53 and with the shaft 30 at all times during rotation of the shaft as well as when the shaft is stationary. Cavity 66 is shown filled with metal particulates comprising, preferably, tungsten beads or substantially spherical pellets 69, preferably of a size comparable to no. six pellets with reference to standard shotgun shot sizes. Other metal particulates may be used to fill the cavity 66 but tungsten or lead spherical beads or pellets have provided good results since these materials are somewhat self lubricating and have not shown a tendency to score or gall the surface of the shaft 30 or the housing wall defining the bore 53. A quantity of metal particulates 69 may be introduced into the cavity 66 through a port 71 closable by a suitable plug 72, as shown in FIG. 3.

The provision of the conductive metal particulates 69 in intimate contact with the shaft 30 and with the housing 48 provides an effective "seal" to prevent transmission of electromagnetic radiation from the exterior of the enclosure 10 into the interior or vice versa. The component parts of the seal 34 including the plate 40, the housing 48, the end cap 50, the retaining rings 60, the wave washers or springs 62 and the bearings 46 and 56 are all metal components, preferably, and the material of the bearings 46 and 56 is preferably as previously mentioned. Accordingly, radiation transmitted along or through the shaft 30 between the exterior and exterior of the enclosure 10 is substantially prevented.

Figure 4:
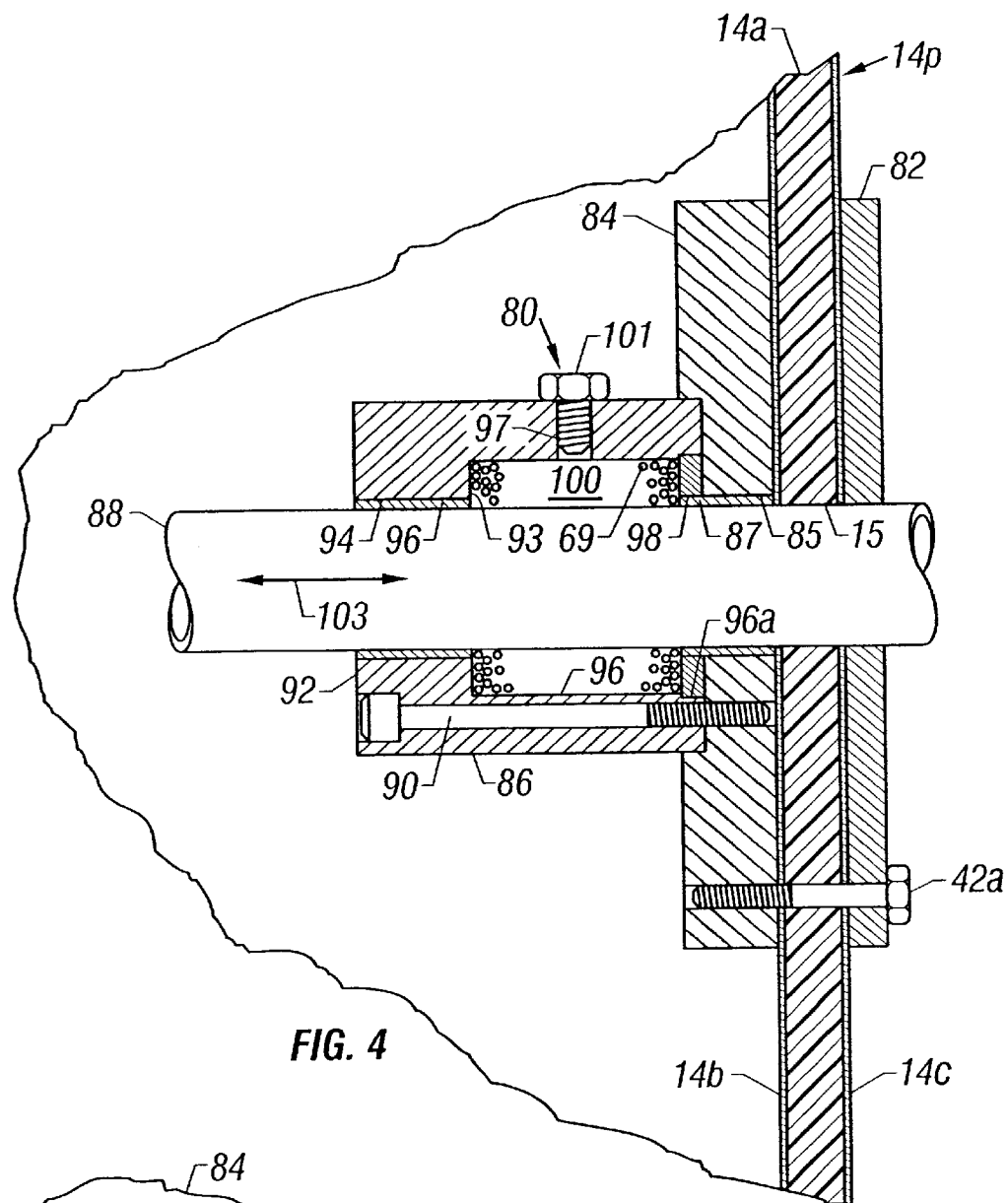
FIG. 4 is a central section view of a first alternate embodiment of a seal mechanism in accordance with the invention and taken from the line 4—4 of FIG. 5.
Figure 5:
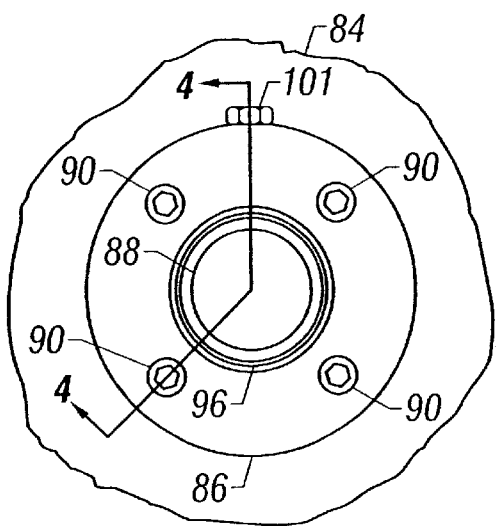
FIG. 5 is an end elevation of the shaft seal or shield shown in FIG. 4.

Referring now to FIGS. 4 and 5, an alternate embodiment of a seal for electromagnetic radiation is illustrated and generally designated by the numeral 80. The seal 80 is also shown supported on wall 14 in place of the seal 34, for example, and is characterized by a cylindrical metal outer support plate 82 similar in some respects to the plate 38, a cylindrical metal inner support plate 84, similar to the plate 40 and a generally cylindrical metal housing 86 similar in some respects to housing 48. An elongated tubular sleeve or shaft 88 extends through bore 15 of a panel 14p of wall 14. Threaded fasteners 42a, one shown, extend through suitable fastener receiving bores in the panel 14p and are threadedly engaged with the plate 84, as illustrated in FIG. 4. Housing 86 is mounted on the plate 84 by plural circumferentially spaced threaded fasteners 90 comprising, for example, socket-head machine screws. Housing 86 has an integral end cap or end wall 92 formed thereon and a cylindrical bore 94 formed therein for supporting a silicon bronze graphite sleeve bearing 96.

Plate 84 also includes a cylindrical bore 85, FIG. 4, in which is supported a corresponding sleeve bearing 87 similar to or identical to the bearing 96. Housing 86 includes a generally cylindrical bore 96 and a removable annular collar 98 disposed in a slightly enlarged counter bore 96a formed in the housing 86. An annular cavity 100 is defined by the bore 96, transverse housing end wall 93, removable collar 98 and the exterior surface of the tubular shaft 88. Cavity 100 is filled with metal particulates 69 which are introduced thereinto, preferably, through a port 97 closable by a suitable threaded plug 101. Accordingly, the seal 80 is substantially like the seal 34 in that a cavity is provided which is filled with a metal particulate media, preferably lead or tungsten pellets or "shot", which is in intimate contact with the exterior surface of the shaft 88 as well as surfaces of the housing 86 formed by the bore 96, the wall 93 and the collar 98. However, with the arrangement of the seal 80, the shaft 88 may be rotated as well as moved longitudinally or reciprocably in the direction of the double-headed narrow 103, for example.

The shaft 88 may be a rigid outer conductor for a coaxial cable, for example, or a shaft which requires longitudinal or reciprocating movement as described or a combination of such movement with rotation, as needed. However, since tube or shaft 88 is in intimate contact with the metal particulates 69, transmission of electromagnetic radiation through the shaft between the exterior of the enclosure 10 and the interior is substantially eliminated. The components of the seal 80 including the plate 84, the housing 86, the bearings 85 and 94 and the collar or retainer 98 may also be formed of materials compatible with the intended purpose of the seal 80 and as described above for the embodiment of FIGS. 1 through 3.

The construction and operation of the exemplary embodiments of the invention shown and described herein is believed to be readily understandable to those of ordinary skill in the art based on the foregoing description when read in conjunction with the drawings. Although preferred embodiments of the invention have been described in detail, those skilled in the art will also recognize that various substitutions and modifications may be made to the invention without departing from the scope and spirit of the appended claims.

What is claimed is:

1. A seal for preventing transmission of electromagnetic radiation through a wall of an enclosure said seal comprising:
   a shaft having a proximal end for penetrating a wall of an enclosure;
   a housing adapted for mounting on the wall, said housing having a cavity formed therein, said cavity being adapted to receive therethrough a distal end of said shaft; and
   electrically conductive metal particulates disposed in said cavity for preventing transmission of electromagnetic radiation through said shaft.
2. The seal set forth in claim 1 wherein:
   said metal particulates comprise one of lead and tungsten pellets.
3. The seal set forth in claim 2 wherein:
   said pellets are generally spherical.
4. The seal set forth in claim 1 including:
   bearing means supported by said seal for supporting said shaft for one of rotary and linear motion with respect to said housing.
5. The seal set forth in claim 4 wherein:
   said seal comprises at least a first plate member mountable directly on said wall and supporting said housing.
6. The seal set forth in claim 5 wherein:
   said bearing means comprises a first bearing supported by said housing and a second bearing supported by said first plate member.
7. The seal set forth in claim 6 wherein:
   said housing includes a removable end cap, one of said bearings being mounted in said end cap.
8. The seal set forth in claim 1 including:
   opposed collars mounted in said cavity and engageable with spaced apart opposed shoulders on said shaft, respectively, and spring means engageable with said collars for biasing said collars into engagement with said shoulders, respectively, for axially centering said shaft in said housing.
9. The seal set forth in claim 1 including:
   a fill port in said housing for filling said cavity with said metal particulates and a removable plug for closing said fillport.
10. The seal set forth in claim 1 wherein:
    said metal particulates are in intimate contact with said shaft and said housing.
11. The seal set forth in claim 10 wherein:
    said housing is formed of electrically conductive material.
12. The seal set forth in claim 11 wherein:
    said shaft is formed of electrically conductive material.
13. The seal set forth in claim 1 wherein:
    said shaft is formed of electrically conductive material.
14. The seal set forth in claim 1 wherein:
    said metal particulates are generally spherical metal pellets.

* * * * *